United States Patent [19]

Muraishi

[11] Patent Number: 4,988,874
[45] Date of Patent: Jan. 29, 1991

[54] RECORDING MEDIUM MAGAZINE FOR ELECTRON MICROSCOPES

[75] Inventor: Katsuaki Muraishi, Kanagawa, Japan

[73] Assignee: Fuji Photo Film Co., Ltd., Kanagawa, Japan

[21] Appl. No.: 407,071

[22] Filed: Sep. 14, 1989

[30] Foreign Application Priority Data

Sep. 14, 1988 [JP] Japan .................. 63-230599

[51] Int. Cl.$^5$ ............................................. G03B 42/00
[52] U.S. Cl. .............................. 250/327.2; 250/484.1
[58] Field of Search ..................... 250/327.2, 484.1

[56] References Cited

U.S. PATENT DOCUMENTS

| | | | |
|---|---|---|---|
| 4,258,264 | 3/1981 | Kotera et al. | 250/484.1 |
| 4,276,473 | 6/1981 | Kato et al. | 250/327.2 |
| 4,315,318 | 2/1982 | Kato et al. | 382/6 |
| 4,387,428 | 6/1983 | Ishida et al. | 364/413.13 |
| 4,456,239 | 6/1984 | Yamaguchi | 250/327.2 |
| 4,485,304 | 11/1984 | Teraoka et al. | 250/327.2 |
| 4,578,582 | 3/1986 | Takano | 250/327.2 |
| 4,651,220 | 3/1987 | Hosoi et al. | 358/471 |
| 4,667,102 | 5/1987 | Koyama et al. | 250/327.2 |
| 4,723,074 | 2/1988 | Kimura | 250/327.2 |
| 4,786,807 | 11/1988 | Kimura | 250/327.2 |
| 4,787,521 | 11/1988 | Utsumi et al. | 250/327.2 X |
| 4,810,886 | 3/1989 | Mori et al. | 250/311 |
| 4,855,599 | 8/1989 | Ohgoda et al. | 250/327.2 |
| 4,900,926 | 2/1990 | Yoshimura et al. | 250/327.2 |
| 4,908,514 | 3/1990 | Bauer et al. | 250/327.2 |
| 4,928,016 | 5/1990 | Mori et al. | 250/440.1 |

FOREIGN PATENT DOCUMENTS

| | | | |
|---|---|---|---|
| 181507 | 5/1986 | European Pat. Off. | 250/311 |
| 56-11395 | 2/1981 | Japan . | |
| 317732 | of 1987 | Japan . | |

Primary Examiner—Constantine Hannaher
Assistant Examiner—Jacob Eisenberg
Attorney, Agent, or Firm—Sughrue, Mion, Zinn, Macpeak & Seas

[57] ABSTRACT

A recording medium magazine for an electron microscope feeds recording media to a recording position at which a recording medium is exposed to an electron beam which has passed thorugh a sample in an electron microscope. The recording medium magazine comprises a holder accommodating device for holding a plurality of holders which are permeable to an electron beam and each of which houses a single stimulable phosphor sheet serving as the recording medium so that the stimulable phosphor sheet can be taken out. A holder feed-in and feed-out device feeds the holders into and out of the holder accommodating device. A movement device moves the holder accommodating device with respect to the holder feed-in and feed-out device until a holder held in the holder accommodating device is associated with the holder feed-in and feed-out device.

7 Claims, 3 Drawing Sheets

RECORDING MEDIUM MAGAZINE FOR ELECTRON MICROSCOPES

BACKGROUND OF THE INVENTION

1. Field of the Invention

This invention relates to a magazine for accommodating a plurality of recording media in an electron microscope. This invention particularly relates to a recording medium magazine for accommodating stimulable phosphor sheets which are housed in holders.

2. Description of the Prior Art

Electron microscopes have heretofore been known wherein an electron beam which has passed through a sample is refracted with an electric field or a magnetic field in order to obtain enlarged images of samples. In general, the electron microscope is provided with a camera chamber. A recording medium such as photographic film is positioned in the camera chamber and exposed to an electron beam which has passed through a sample in order to record an electron microscope image of the sample on the recording medium.

In cases where the recording medium is photographic film, a single sheet of photographic film is housed in a cassette and used to record an electron microscope image. After the recording of the electron microscope image is finished, the cassette is taken out of the camera chamber. The photographic film is then taken out of the cassette and subjected to development processing.

The applicant proposed in U.S. Pat. Nos. 4,651,220 and 4,847,497 novel systems for recording and reproducing an electron microscope image wherein, instead of photographic film being used, a stimulable phosphor sheet as disclosed in U.S. Pat. Nos. 4,258,264, 4,276,473, 4,315,318 and 4,387,428 and Japanese Unexamined Patent Publication No. 56(1981)-11395 is utilized as a recording medium. Basically, the proposed systems for recording and reproducing an electron microscope image comprise the steps of (i) exposing a stimulable phosphor sheet to an electron beam which has passed through a sample in a vacuum in order to store the energy of the electron beam on the stimulable phosphor sheet, (ii) thereafter exposing the stimulable phosphor sheet to stimulating rays or the like in order to release the stored energy in the form of emitted light, (iii) photoelectrically detecting the emitted light to obtain an image signal, and (iv) using the image signal to reproduce an electron beam image of the sample.

Also, as disclosed in U.S. Pat. No. 4,889,990, a novel electron microscope has been proposed wherein photographic film or a stimulable phosphor sheet is selectively used as a recording medium in a single camera chamber.

In general, a plurality of recording media such as photographic film or stimulable phosphor sheets are housed in a feed magazine which is located in an electron microscope. The recording media are fed one after another from the feed magazine and located at a recording position where a recording medium is exposed to an electron beam. Recording media on which electron microscope images have been recorded are sequentially fed into a housing magazine which is capable of housing a plurality of recording media.

The applicant also proposed in Japanese Patent Application No. 62(1987)-317732 now U.S. Pat. No. 4,926,016, a magazine for housing both recording media on which no images have been recorded and recording media on which images have been recorded. The proposed magazine comprises a medium housing rack which is composed of a plurality of medium housing compartments each of which compartments houses a single recording medium. The medium housing rack can be moved vertically. A housing means is provided to push a recording medium, which is located at a predetermined height, out of the rack and to move a recording medium into the rack. Because a single magazine houses both unused recording media and used recording media on which images have been recorded, the number of magazines which are to be provided in an electron microscope can be kept small.

However, actually, photographic film is housed in a cassette when it is used in the camera chamber. On the other hand, stimulable phosphor sheets are used without being housed in cassettes because, for example, it is necessary for the stimulable phosphor sheets to be bent and conveyed when they are subjected to an image read-out operation wherein they are exposed to stimulating rays in order to obtain an image signal. Because cassettes housing photographic film and stimulable phosphor sheets are different in mechanical properties, they cannot be conveyed smoothly in the electron microscope. Therefore, in the electron microscope wherein photographic film and stimulable phosphor sheets are used selectively, a magazine for housing photographic film and a magazine for housing stimulable phosphor sheets must be provided independently from each other. Also, a conveyance system for photographic film and a conveyance system for stimulable phosphor sheets must be provided independently from each other. As a result, the electron microscope becomes large in size.

SUMMARY OF THE INVENTION

The primary object of the present invention is to provide a recording medium magazine for an electron microscope, which houses both recording media having no images recorded thereon and recording media having images recorded thereon, and which houses both stimulable phosphor sheets and photographic film.

Another object of the present invention is to provide a recording medium magazine for an electron microscope, which enables both stimulable phosphor sheets and photographic film to be used in an electron microscope while the electron microscope is kept small in size.

The present invention provides a recording medium magazine for an electron microscope, which magazine feeds recording media to a recording position at which a recording medium is exposed to an electron beam which has passed through a sample in an electron microscope, the recording medium magazine comprising:
(i) a holder accommodating means for holding a plurality of holders which are permeable to an electron beam and each of which houses a single stimulable phosphor sheet serving as the recording medium so that the stimulable phosphor sheet can be taken out,
(ii) a holder feed-in and feed-out means which feeds the holders into and out of said holder accommodating means, and
(iii) a movement means for moving said holder accommodating means with respect to said holder feed-in and feed-out means until a holder held in said holder accommodating means is associated with said holder feed-in and feed-out means.

The recording medium magazine for an electron microscope in accordance with the present invention holds holders which house stimulable phosphor sheets. In cases where sheets of photographic film are housed in the holders instead of being housed in conventional cassettes, both photographic film and stimulable phosphor sheets can be accommodated in a single magazine. Also, in cases where the holders have the same shape as the cassettes, both photographic film housed in the cassettes and stimulable phosphor sheets housed in the holders can be accommodated in the magazine. In cases where both stimulable phosphor sheets and photographic film are accommodated in a single magazine, it is necessary for a stimulable phosphor sheet or photographic film to be selectively taken out of the magazine and used as a recording medium. With the recording medium magazine for an electron microscope in accordance with the present invention, the holder accommodating means is moved with respect to the holder feed-in and feed-out means until a desired holder is associated with the holder feed-in and feed-out means. Therefore, wherever a desired holder is located in the holder accommodating means, the holder (or a cassette) which houses a desired recording medium can be taken out of the magazine.

DESCRIPTION OF THE PREFERRED EMBODIMENTS

The present invention will hereinbelow be described in further detail with reference to the accompanying drawings.

Figure 1:
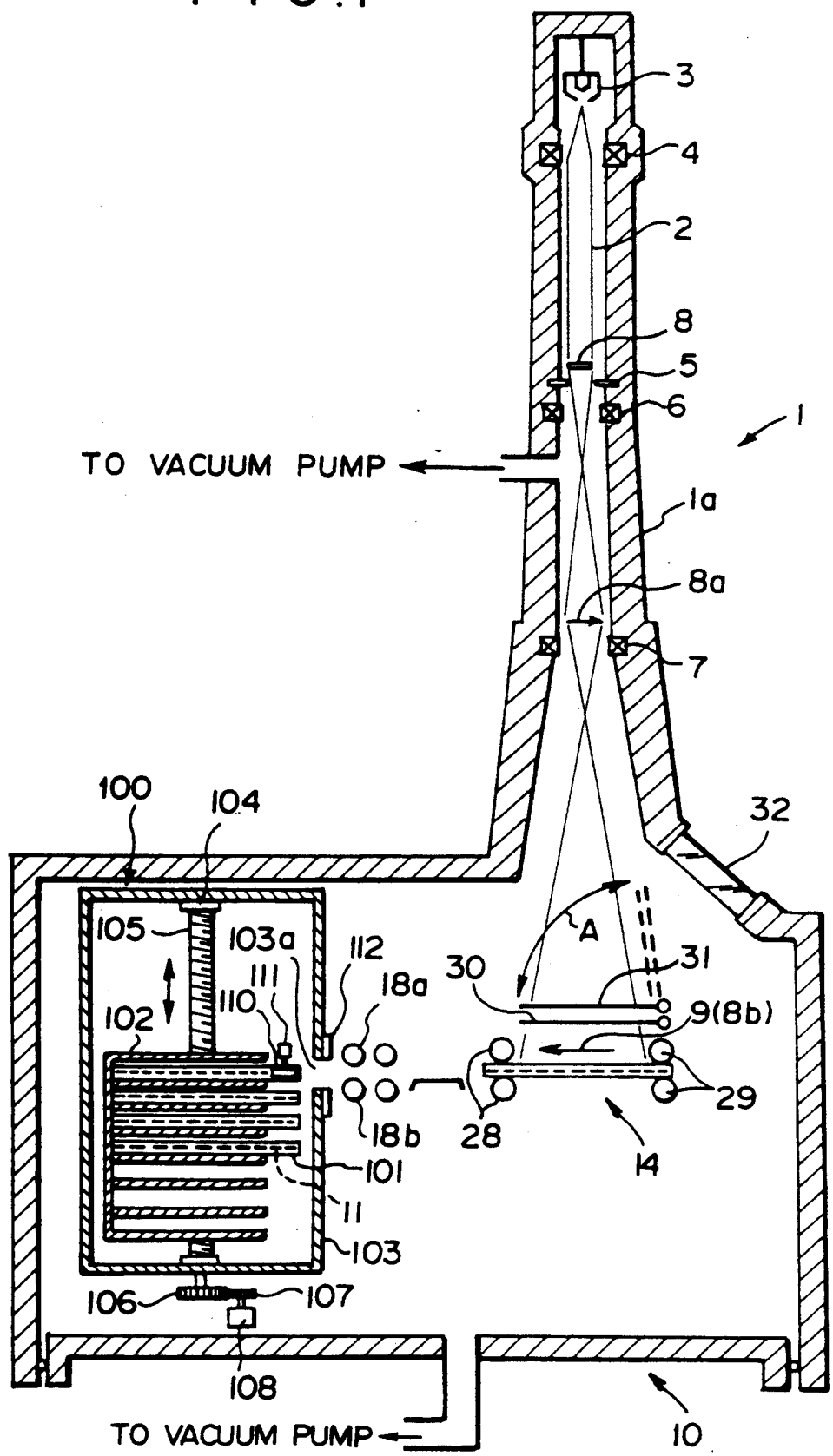
FIG. 1 is a schematic view showing an electron microscope wherein an embodiment of the recording medium magazine for an electron microscope in accordance with the present invention is employed.

With reference to FIG. 1, a microscope body 1a of an electron microscope 1 is provided with an electron gun 3 for emitting an electron beam 2 at a uniform speed, at least one converging lens 4 for converging the electron beam 2 onto a sample plane, a sample supporting base 5, an objective lens 6 of the same type as the converging lens 4, and a projection lens 7. The electron beam 2 passing through a sample 8 disposed on the sample supporting base 5 is refracted by the objective lens 6 to form an enlarged scattering image 8a of the sample 8. The enlarged scattering image 8a is projected by the projection lens 7, and an image 8b forms at a plane of image formation 9.

An electron microscope image recording apparatus 10 is disposed under the microscope body 1a. The electron microscope image recording apparatus 10 is provided with a recording medium magazine 100 (hereinafter simply referred to as a magazine) which is capable of accommodating a plurality of stimulable phosphor sheets 11, 11, . . . serving as recording media. A recording section 14 is located at a position including the plane of image formation 9.

Figure 2:
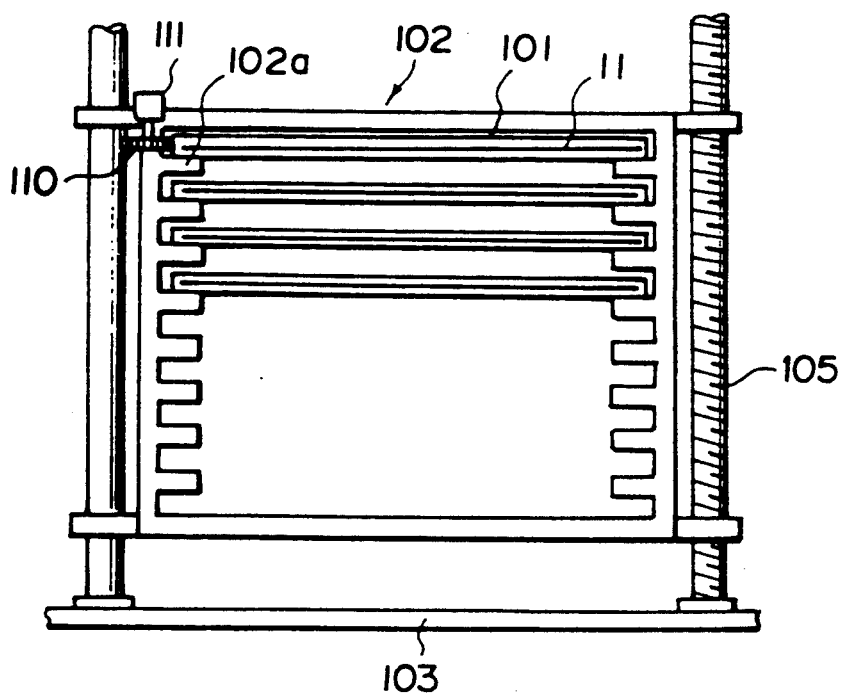
FIG. 2 is a front view showing the configuration in the magazine.

As shown in FIGS. 1 and 2, the magazine 100 is provided with a holder accommodating means 102 which is capable of holding a plurality of holders 101, 101, . . . each of which houses a single stimulable phosphor sheet 11. The holders 101, 101, . . . are supported on protrusions 102a, 102a, . . . and positioned one above another. The holder accommodating means 102 is engaged with a screw rod 105 which is secured to a case 103 of the magazine 100 via a bearing 104. A motor 108 rotates a gear 107 which is engaged with a gear 106. As a result, the screw rod is rotated by the gear 106 in order vertically to move the holder accommodating means 102. A slit 103a is formed in a side face of the case 103 on the side of the recording section 14. A holder 101 is fed through the slit 103a into and out of the magazine 100.

Figure 3:
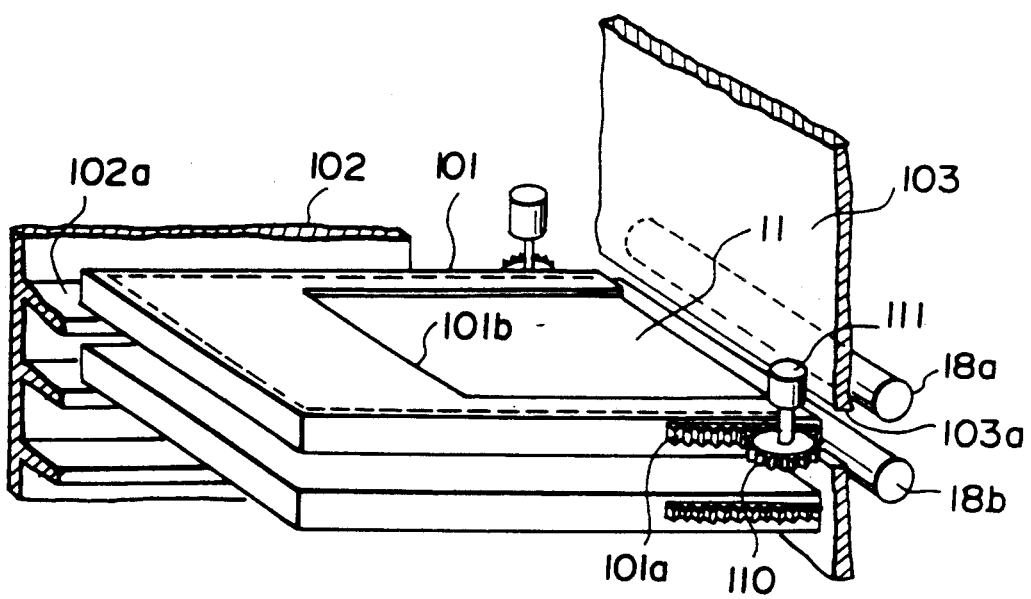
FIG. 3 is a perspective view showing the major part of the magazine.

When a holder 101 which houses a stimulable phosphor sheet 11 having no image recorded thereon is to be fed out of the magazine 100, the holder accommodating means 102 is moved vertically until the holder 101 faces the slit 103a. Thereafter, the holder 101 is fed by a holder feed-in and feed-out means out of the magazine 100 through the slit 103a. Specifically, as shown in FIG. 3, racks 101a, 101a are secured to both side faces of the holder 101. Pinions 110, 110 for engaging with the racks 101a, 101a are located in the vicinity of the slit 103a. After the holder accommodating means 102 is moved vertically until the racks 101a, 101a of the holder 101 which should be fed out of the magazine 100 engage with the pinions 110, 110, the pinions 110, 110 are rotated by corresponding motors 111, 111 in order to feed the holder 101 out of the holder accommodating means 102. In this embodiment, the holder feed-in and feed-out means is constituted of the racks 101a, 101a and the pinions 110, 110.

The holder 101 which has been fed out of the holder accommodating means 102 in the manner described above until the holder 101 is projected out of the slit 103a is grasped by conveying rollers 18a and 18b which are located in the vicinity of the slit 103a. The holder 101 is conveyed by the conveying rollers 18a and 18b and other conveying rollers to the recording section 14, and stopped at the plane of image formation 9 by a pair of nip rollers 28, 28 and a pair of nip rollers 29, 29 which are located in the recording section 14. The holder 101 is made of a material permeable to an electron beam. The stimulable phosphor sheet 11 housed in the holder 101 is used to record an electron microscope image.

A shutter 30 and a fluorescent screen 31 which are rotatable by levers (not shown) in the directions indicated by the double headed arrow A are provided between the microscope body 1a and the recording section 14. An inspection window 32 provided with a lead glass or the like is formed in the circumferential wall of the microscope body 1a above the fluorescent screen 31. The electron beam 2 impinges upon the fluorescent screen 31 and causes it to produce fluorescence, and therefore the enlarged scattering image 8a which the electron beam 2 carries can be viewed through the inspection window 32. After the focusing point, the magnification and the field range of the enlarged scattering image 8a are adjusted by an operator viewing the fluorescent screen 31 through the inspection window 32, the shutter 30 and the fluorescent screen 31 are rotated by the levers to the positions that do not intercept the electron beam 2. Accordingly, the electron beam 2 impinges upon the stimulable phosphor sheet 11 housed in the holder 101 held at the recording section 14, and energy of the electron beam 2 carrying the enlarged scattering image 8b is stored on the stimulable phosphor sheet 11.

After the stimulable phosphor sheet 11 is exposed to the electron beam 2, the shutter 30 is closed. The holder 101 housing the stimulable phosphor sheet 11, on which the enlarged scattering image 8b has been stored, is moved leftwardly in FIG. 1 by the nip rollers 28, 28 and nip rollers 29, 29, and conveyed by the conveying rollers 18a and 18b into the magazine 100. Before the holder 101 is conveyed into the magazine 100, the holder accommodating means 102 in the magazine 100 is moved until an empty part faces the slit 103a. The holder 101 is conveyed by the conveying rollers 18a and 18b into the holder accommodating means 102 until the racks 101a, 101a engage with the pinions 110, 110. Thereafter, the pinions 110, 110 are rotated until the holder 101 is completely accommodated in the holder accommodating means 102. Light shielding plates 112, 112 are located above and below the slit 103a in order to cover the slit 103a and prevent light from entering the magazine 100 when no holder 101 is to be fed into and out of the magazine 100.

In the manner described above, holders 101, 101, . . . which house stimulable phosphor sheets 11, 11, . . . having no image recorded thereon are sequentially fed out of the magazine 100 and used to record electron microscope images. Some of the holders 101, 101, . . . may house photographic film in lieu of the stimulable phosphor sheets. The stimulable phosphor sheets or photographic film may be selectively fed out of the magazine 100 in accordance with the type of electron microscope image or the like. The holder accommodating means 102 is vertically moved in order to take a desired holder 101 out of the magazine 100. Therefore, a holder 101 which houses a desired recording medium can be taken out of the magazine 100. Feeding of a holder 101 out of the magazine 100, the image recording, and feeding of the holder 101, after being used to record an electron microscope image, into the magazine 100 are repeated in the manner described above. After all stimulable phosphor sheets 11, 11, . . . housed in the holders 101, 101, . . . have been subjected to the image recording and fed into the magazine 100, the magazine 100 is taken out of the electron microscope image recording apparatus 10. Electron microscope images stored on the stimulable phosphor sheets 11, 11, . . . are then read out in a known radiation image read-out apparatus.

During the operation of the electron microscope 1, the inside of the microscope body 1a and the inside of the electron microscope image recording apparatus 10 are maintained in a vacuum by a known evacuation device. A known shielding member (not shown) is provided between the microscope body 1a and the electron microscope image recording apparatus 10 in order to shield the inside of the microscope body 1a and the inside of the electron microscope image recording apparatus 10 from each other. Therefore, the inside of the microscope body 1a is maintained in a vacuum even when the vacuum in the electron microscope image recording apparatus 10 breaks at the time the magazine 100 is fed into and out of the electron microscope image recording apparatus.

Figure 4:
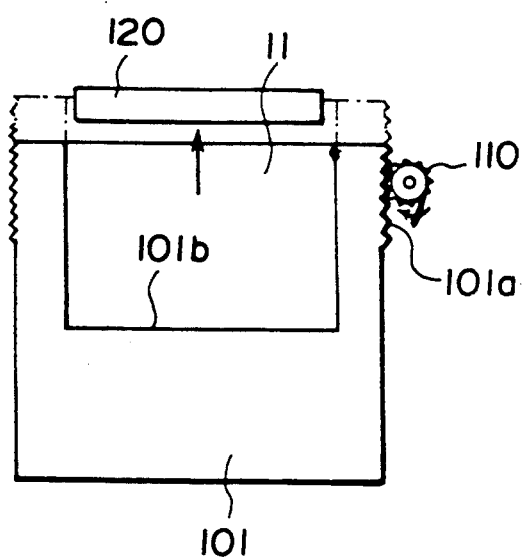
FIG. 4 is a plan view showing a holder located in a read-out apparatus.

When an electron microscope image is to be read from a stimulable phosphor sheet 11, it is necessary to take the stimulable phosphor sheet 11 out of the holder 101 and feed the stimulable phosphor sheet 11 to a read-out apparatus. At this time, the holder 101 need not necessarily be taken out of the magazine 100. As shown in FIGS. 3 and 4, in order to take a stimulable phosphor sheet 11 out of a holder 101, cutaway parts 101b, 101b are formed in the upper and lower surfaces of each holder 101. Specifically, as shown in FIG. 4, the read-out apparatus is provided with a nip rollers 120, 120 which serve as a stimulable phosphor sheet take-out means. The nip rollers 120, 120 have lengths shorter than the widths of the cutaway parts 101b, 101b and are located close to a position at which the magazine 100 is set in the read-out apparatus. The pinions 110, 110 are rotated in engagement with the racks 101a, 101a in order to move holder 101 housing the stimulable phosphor sheet 11 in the direction indicated by the arrow in FIG. 4 until the portion of the stimulable phosphor sheet 11 laid bare at the cutaway parts 101b, 101b is grasped by the nip rollers 120, 120. The pinions 110, 110 are then stopped from rotating. After the stimulable phosphor sheet 11 is completely fed out of the holder 101 by the nip rollers 120, 120, the pinions 110, 110 are rotated reversely in order to return the holder 101 into the magazine 100. In this manner, the holder 101 is slightly moved forwardly and backwardly in order to feed the stimulable phosphor sheet 11 from the holder 101 into a read-out zone in the read-out apparatus.

The recording medium magazine for an electron microscope in accordance with the present invention may be constituted in any other manner insofar as a plurality of holders are accommodated and a desired holder can be selectively fed out of the magazine. For example, holders may be positioned upright and supported side by side in the holder accommodating means. Also, in order to feed a holder into and out of the magazine, a holder feed-in and feed-out means may be moved with respect to the holder accommodating means.

I claim:

1. A recording medium magazine for an electron microscope, which magazine feeds recording media to a recording position at which a recording medium is exposed to an electron beam which has passed through a sample in an electron microscope, the recording medium magazine comprising:
(i) a holder accommodating means for holding a plurality of holders which are permeable to an electron beam and each of which houses a single stimulable phosphor sheet serving as the recording medium so that the stimulable phosphor sheet can be taken out,
(ii) a holder feed-in and feed-out means which feeds the holders into and out of said holder accommodating means, and
(iii) a movement means for moving said holder accommodating means with respect to said holder feed-in and feed-out means until a holder held in said holder accommodating means is associated with said holder feed-in and feed-out means.

2. A recording medium magazine as defined in claim 1 wherein said holder feed-in and feed-out means is constituted of racks, which are secured to both side faces of each said holder, and pinions for engagement with said racks, and said holder accommodating means is moved with respect to said pinions.

3. A recording medium magazine as defined in claim 1 wherein each said holder has a cutaway part at least in one surface in order to lay a portion of the stimulable phosphor sheet bare and to enable a means for taking the stimulable phosphor sheet out of said holder to access said portion of the stimulable phosphor sheet.

4. A recording medium magazine as defined in claim 1 further comprising a magazine case having a slit, through which the holders are fed into and out of said recording medium magazine, and at least one light-shielding plate for covering said slit.

5. A recording medium magazine for an electron microscope, which magazine feeds recording media to a recording position at which a recording medium is exposed to an electron beam which has passed through a sample in an electron microscope, said recording medium magazine comprising:

a holder accomodating means for holding a plurality of holders and each of which houses a recording medium;

a holder feed-in and feed-out means which selectively feeds the holders into and out of said holder accomodating means; and a movement means for moving said holder accomodating means with respect to said holder feed-in and feed-out means until a desired holder held in said holder accomodating means is aligned with said holder feed-in and feed-out means.

6. A recording medium magazine as defined in claim 5, wherein said holder feed-in and feed-out means is constituted of racks, which are secured to both side faces of each said holder, and pinions for engagement with said racks, and said holder accomodating means is moved with respect to said pinions.

7. A recording medium magazine as defined in claim 5, further comprising a magazine case having a slit, through which the holders are fed into and out of said recording medium magazine, and at least one light-shielding plate for covering said slit.

* * * * *